(12) United States Patent
Kim et al.

(10) Patent No.: US 8,501,550 B2
(45) Date of Patent: Aug. 6, 2013

(54) METHOD OF FABRICATING GATE AND METHOD OF MANUFACTURING SEMICONDUCTOR DEVICE USING THE SAME

(75) Inventors: Jong-Pil Kim, Hwaseong-si (KR); Young-Goan Jang, Anyang-si (KR); Dong-Won Kim, Seongnam-si (KR); Hag-Ju Cho, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 79 days.

(21) Appl. No.: 13/238,330

(22) Filed: Sep. 21, 2011

(65) Prior Publication Data

US 2012/0115298 A1    May 10, 2012

(30) Foreign Application Priority Data

Nov. 4, 2010    (KR) ........................ 10-2010-0109162

(51) Int. Cl.
*H01L 21/335*    (2006.01)
*H01L 21/8232*    (2006.01)

(52) U.S. Cl.
USPC ........... 438/142; 438/195; 438/196; 438/183; 438/176; 438/199; 257/411; 257/369

(58) Field of Classification Search
USPC .. 438/142, 183, 195, 196, 176, 199; 257/411, 257/369
See application file for complete search history.

(56) References Cited

U.S. PATENT DOCUMENTS

| | | | |
|---|---|---|---|
| 7,863,695 B2 * | 1/2011 | Suzuki et al. | ................. 257/411 |
| 2009/0114995 A1 * | 5/2009 | Suzuki et al. | ................. 257/369 |

FOREIGN PATENT DOCUMENTS

| | | | |
|---|---|---|---|
| KR | 10-2002-0034635 A | | 5/2002 |
| KR | 10-2002-0040232 A | | 5/2002 |
| KR | 10-2004-0085912 A | | 10/2004 |

* cited by examiner

*Primary Examiner* — Telly Green
(74) *Attorney, Agent, or Firm* — Lee & Morse, P.C.

(57) ABSTRACT

A method of fabricating a gate includes sequentially forming an insulation layer and a conductive layer on substantially an entire surface of a substrate. The substrate has a device isolation layer therein and a top surface of the device isolation layer is higher than a top surface of the substrate. The method includes planarizing a top surface of the conductive layer and forming a gate electrode by patterning the insulation layer and the conductive layer.

11 Claims, 11 Drawing Sheets

METHOD OF FABRICATING GATE AND METHOD OF MANUFACTURING SEMICONDUCTOR DEVICE USING THE SAME

CROSS-REFERENCE TO RELATED APPLICATION

Korean Patent Application No. 10-2010-0109162, filed on Nov. 4, 2010, in the Korean Intellectual Property Office, and entitled: "Method of Fabricating Gate and Method of Manufacturing Semiconductor Device Using the Same," is incorporated by reference herein in its entirety.

BACKGROUND

1. Field

Embodiments relate to a method of fabricating a gate and a method of manufacturing a semiconductor device using the same, and to a method of fabricating a gate, which may secure processing uniformity, and a method of manufacturing a semiconductor device using the gate fabricating method.

2. Description of the Related Art

A semiconductor device may be highly integrated and may be formed by multiple layers.

SUMMARY

Embodiments may be realized by providing a method of fabricating a gate that includes sequentially forming an insulation layer and a conductive layer on substantially an entire surface of a substrate, the substrate has a device isolation layer therein, and a top surface of the device isolation layer is higher than a top surface of the substrate. The method also includes planarizing a top surface of the conductive layer, and forming a gate electrode by patterning the insulation layer and the conductive layer.

The gate electrode formed by patterning the insulation layer and the conductive layer may be one of a plurality of gate electrodes formed by patterning the insulation layer and the conductive layer. A top surface of each of the plurality of gate electrodes may be at a height equal to or greater than a height of the top surface of the substrate. The conductive layer may be made of polysilicon, a metal, or a metal silicide. The planarizing may be performed prior to forming the gate electrode by a chemical mechanical polishing process.

The method may include forming the device isolation layer in the substrate by etching the substrate to a predetermined depth to form a trench in the substrate, and depositing an oxide layer such that the oxide layer is on substantially an entirety of the top surface of the substrate and fills the trench. The method may include removing the oxide layer deposited on the top surface of the substrate such that the oxide layer filling the trench is higher by at a predetermined height than the top surface of the substrate. The removal of the oxide layer may be performed by a chemical mechanical polishing process.

The method may include forming a nitride layer on the conductive layer after planarizing the top surface of the conductive layer such that forming the gate electrode includes patterning the nitride layer.

Embodiments may also be realized by providing a method of manufacturing a semiconductor device that includes sequentially forming a dummy gate insulation layer and a polysilicon layer on substantially an entire surface of a substrate, the substrate has a device isolation layer therein, and a top surface of the device isolation layer is higher than a top surface of the substrate. The method further includes planarizing a top surface of the polysilicon layer, forming a nitride layer on the polysilicon layer after planarizing the top surface of the polysilicon layer, forming poly gates by patterning the dummy gate insulation layer, the polysilicon layer, and the nitride layer, forming source and drain regions on both sides of the poly gates, forming an interlayer dielectric layer on substantially the entire surface of the substrate, and removing portions of the interlayer dielectric layer until the poly gates are exposed.

The removal of the interlayer dielectric layer may be performed by a chemical mechanical polishing process. The planarizing of the top surface of the polysilicon layer may be performed by a chemical mechanical polishing process.

The method may include forming the device isolation layer in the substrate by etching the substrate to a predetermined depth to form a trench in the substrate, and depositing an oxide layer such that the oxide layer is on substantially an entirety of the top surface of the substrate and fills the trench. The method may include removing the oxide layer deposited on the top surface of the substrate such that the oxide layer on the trench is higher by a predetermined height than the top surface of the substrate.

The method may include, after the removal of the portions of the interlayer dielectric layer such that the poly gates are exposed, removing the poly gates exposed by the removal of the interlayer dielectric layer, the removal of the poly gates forming a groove, forming a gate insulation layer to a uniform thickness in the groove and on the interlayer dielectric layer, forming a metal layer on the gate insulation layer, the metal layer completely filling the groove formed by the removal of the poly gates, and forming a metal gate by removing portions of the gate insulation layer and portions of the metal layer on the interlayer dielectric layer until the interlayer dielectric layer is exposed.

The removal of the gate insulation layer and the metal layer may be performed by a chemical mechanical polishing process. The method may include, after the forming of the poly gates, forming gate spacers by depositing at least one of an oxide layer and a nitride layer on the substrate and the poly gates, and etching the at least one of the oxide layer and the nitride layer on the substrate.

The source and drain regions may be made of doped silicon or doped silicon germanium. The source and drain regions may be formed on the substrate at both sides of the poly gates by a selective epitaxial growth process. The source and drain regions may be formed by forming an epitaxial layer forming trench by etching a predetermined portion of the substrate at both sides of the poly gates, and forming a silicon germanium epitaxial layer in the epitaxial layer forming trench. The epitaxial layer forming trench may have a hexagonal profile.

Embodiments may also be realized by providing a method of fabricating a gate that includes forming a device isolation layer in a substrate, a top surface of the device isolation layer being higher than a top surface of the substrate, sequentially forming a first layer and a second layer on substantially an entirety of the substrate including the device isolation layer, the second layer having a stepped surface on the substrate, the stepped surface overlapping the device isolation layer, planarizing the second layer such that the stepped surface is removed, and forming a plurality of stacked structures spaced apart on the substrate, after planarizing the second layer by patterning the first layer and the second layer to form a plurality of patterned first layers and a plurality of patterned second layers, at least one of the plurality of patterned second layers being on the device isolation layer, a top surface of each of the plurality of patterned second layers being arranged at a same distance from the substrate.

The at least one of the plurality of patterned second layers on the device isolation layer may have a height that is less than a height of another of the plurality of patterned second layers spaced apart from the device isolation layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
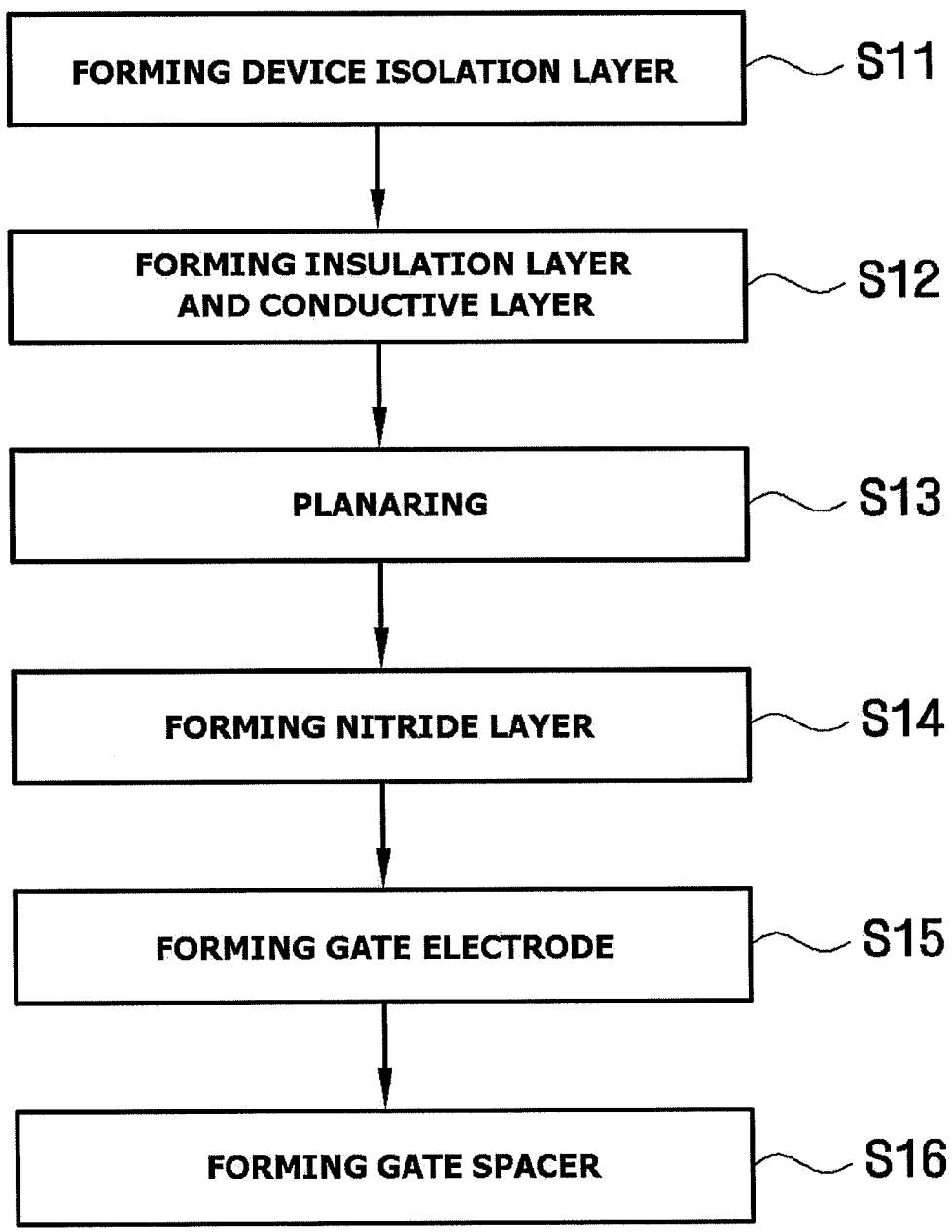
FIG. 1 illustrates a flowchart of a method of fabricating a gate, according to an exemplary embodiment.

Features of embodiments may be understood more readily by reference to the following detailed description of exemplary embodiments and the accompanying drawings; however, they may be embodied in many different forms and should not be construed as being limited to the embodiments set forth herein. Rather, these embodiments are provided so that this disclosure will be thorough and complete and will fully convey the scope of the invention to those skilled in the art.

In the drawing figures, the dimensions of layers and regions may be exaggerated for clarity of illustration. Like reference numerals refer to like elements throughout. It will be understood that when an element or layer is referred to as being "on" another element or layer, it can be directly on the other element or layer or intervening elements or layers may be present. In contrast, when an element is referred to as being "directly on" another element or layer, there are no intervening elements or layers. As used herein, the term "and/or" includes any and all combinations of one or more of the associated listed items.

Spatially relative terms, such as "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of illustrative schematic views of the invention. Accordingly, the exemplary views may be modified depending on manufacturing technologies and/or tolerances. Therefore, the embodiments are not limited to those shown in the views, but include modifications in, e.g., configuration and/or shape, formed on the basis of manufacturing processes. Regions exemplified in figures have schematic properties and shapes of regions shown in figures exemplify specific shapes of regions of elements and not limit aspects of the invention.

Hereinafter, exemplary embodiments will be described in detail with reference to the accompanying drawings.

A method of fabricating a gate according to an exemplary embodiment will be described with reference to FIGS. 1 and 2A to 2F. FIG. 1 illustrates a flowchart of an exemplary method of fabricating a gate, and FIGS. 2A to 2F illustrate cross-sectional views of process stages in an exemplary method of fabricating the gate shown in FIG. 1. In the following detailed descriptions, numerous specific details are set forth to provide a thorough understanding. However, it will be understood by those skilled in the art that the embodiments may be practiced without these specific details. Well-known methods, procedures, components, and processes have not been described in detail so as not to obscure the explanation of the exemplary embodiments.

Referring to FIG. 1, the method of fabricating a gate according to an exemplary embodiment may include a plurality of stages. For example, the stages may include forming a device isolation layer (S11), forming an insulation layer and a conductive layer (S12), planarizing (S13), forming a nitride layer (S14), forming a gate electrode (S15), and/or forming a gate spacer (S16).

Figure 2A:
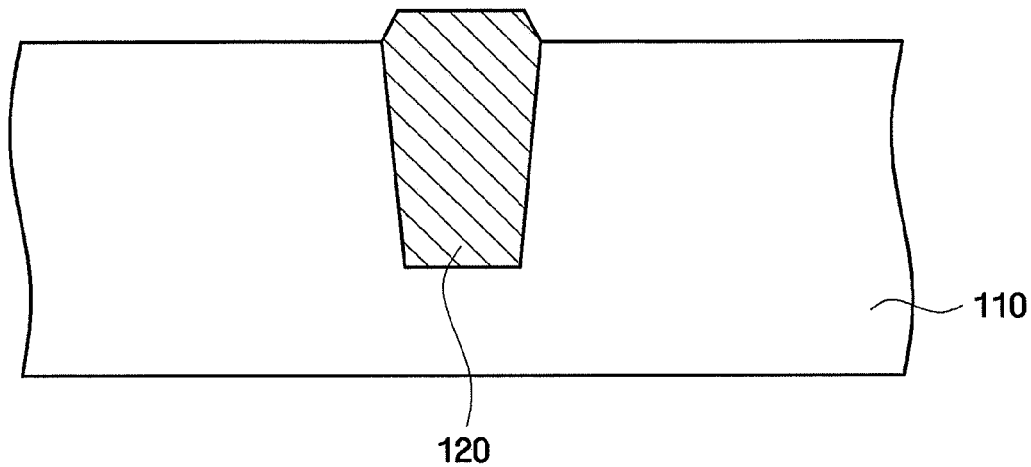
FIGS. 2A to 2F illustrate cross-sectional views of stages in an exemplary method of fabricating the gate shown in FIG. 1.

Referring to FIG. 2A, in stage S11, a device isolation layer 120 may be formed in a substrate 110, e.g., the device isolation layer 120 may be formed in a trench in the substrate 110. The device isolation layer 120 may extend above the substrate 110 so that a top surface of the device isolation layer 120 may be higher than a top surface of the substrate 110. For example, the device isolation layer 120 may form a stepped surface on the substrate 110.

The device isolation layer 120 may form an active region and an isolation region. The active region may be electrical conductive, i.e., may be capable of conducting electricity. The isolation region may isolate elements by minimizing and/or preventing electrical conduction on the substrate 110.

According to an exemplary embodiment, the device isolation layer 120 may be formed in a trench by etching a predetermined portion of the substrate 110. Then, the trench may be filled with an insulating material, and a top surface of the trench may be planarized. The insulating material may include, e.g., an oxidized substance, a high density plasma (HDP) oxidized substance, and/or an undoped silicated glass (USG). The planarizing may be performed a process, e.g., a chemical mechanical polishing (CMP) process, on the insulating material filling the trench.

The planarization of the insulating material may be performed such that a top surface of the device isolation layer 120 is elevated to a predetermined height with respect to the top surface of the substrate, e.g., elevated by a predetermined distance from the substrate. For the purpose of, e.g., minimizing and/or preventing electrical characteristics of the semiconductor device from deteriorating. For example, deterioration due to leakage current being generated at sidewalls of the device isolation layer 120, e.g., in a case where the top surface of the device isolation layer 120 becomes lower than the top surface of the substrate 110 in a subsequent process, may be minimized and/or prevented.

In addition, the device isolation layer 120 may be formed by, e.g., a field oxide (FOX) technique. In the field oxide technique, $O_2$ gas and thermal energy may be applied to a silicon substrate to, e.g., cause an oxidation reaction between silicon and oxygen to form an oxide layer.

The substrate 110 may include, e.g., at least one of a silicon substrate, a silicon on insulator (SOI) substrate, a gallium arsenic substrate, a silicon germanium substrate, a ceramic substrate, a quartz substrate, and a display glass substrate.

The substrate 110 may be a P-type substrate or an N-type substrate. Although not shown, the substrate 110 may include a P-type well and/or an N-type well doped with a p-type or an n-type impurity, respectively.

Figure 2B:
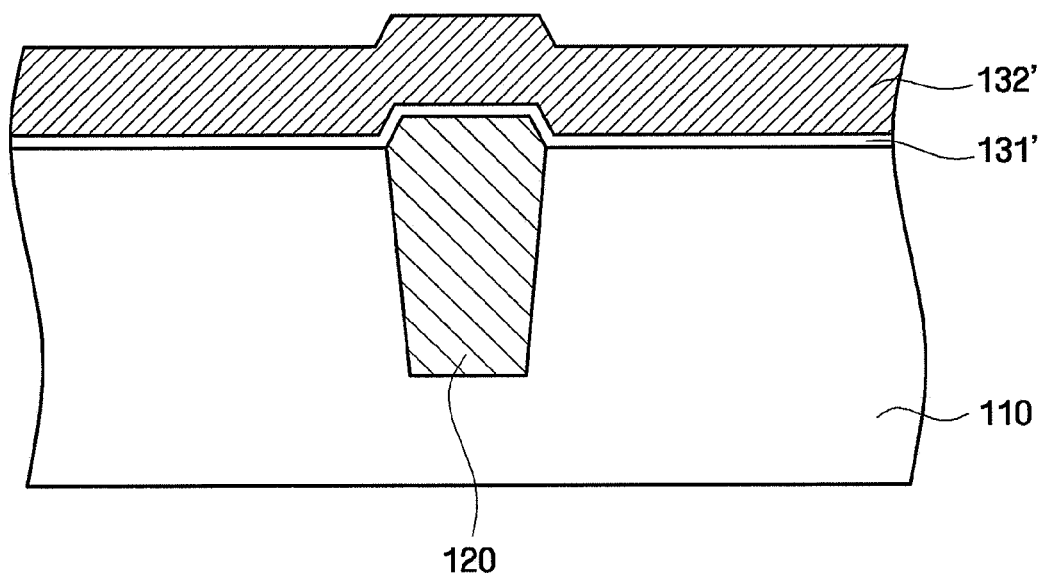

Referring to FIG. 2B, in stage S12, an insulation layer may be formed on the substrate 110, e.g., on substantially an entire surface of the substrate 110. The insulation layer may be for forming a gate insulation layer 131'. A conductive layer may be sequentially formed on the insulation layer, e.g., on substantially an entire surface of the gate insulation layer 131'. The conductive layer may be for forming a gate electrode 132' on the gate insulation layer 131'.

The insulation layer 131' may be deposited on, e.g., directly on, substantially the entire surface of the substrate 110 having the device isolation layer 120 therein by. The insulation layer 131' may be formed by, e.g., a chemical vapor deposition (CVD) process, a sputtering process, or an oxidation process. Referring to FIG. 2B, in a case where the insulation layer 131' is deposited by a CVD or a sputtering process, the insulation layer 131' may be formed on substantially the entire surface of the substrate 110. Although not shown, in a case where the insulation layer 131' is formed by oxidizing, the insulation layer 131' may be substantially excluded, e.g., not formed, on the device isolation layer 120 and may be formed on the active region. In this regard, when the insulation layer 131' is formed by an oxidizing process, an oxidation reaction may occur between silicon in the substrate 110 and oxygen such that the insulation layer 131' is substantially excluded on the device isolation layer 120.

The insulation layer 131' may include, e.g., a silicon oxide, silicon oxynitride (SiON), $Ge_xO_yN_z$, $Ge_xSi_yO_z$, a high-k dielectric material, a combination thereof, or a stacked including at least two of these materials. The high-k dielectric material may include, e.g., but is not limited to, hafnium oxide ($HfO_2$), zirconium oxide ($ZrO_2$), aluminum oxide ($Al_2O_3$), a tantalum oxide such as $Ta_2O_5$, a hafnium silicate, a zirconium silicate, or a combination thereof.

The conductive layer 132' may be formed on, e.g., directly on, the insulation layer 131'. The conductive layer 132' may be formed by, e.g., a CVD process or a sputtering process. Thereafter, the conductive layer 132' may be patterned to form a gate electrode. The conductive layer 132' may be made of, e.g., polysilicon, a metal, a metal silicide, and/or a metal nitride, or may have a stack of one or more of these materials. Examples of the metal may include, e.g., but are not limited to, tungsten (W), cobalt (Co), nickel (Ni), titanium (Ti), tantalum (Ta), or alloys thereof.

In a case where the conductive layer 132' is made of polysilicon, the polysilicon may be directly deposited on the insulation layer 131' by, e.g., a low pressure chemical vapor deposition (LPCVD) process or a plasma enhanced chemical vapor deposition (PECVD) process. Alternatively, the conductive layer 132' made of polysilicon may be formed by depositing amorphous silicon on the insulation layer 131' and crystallizing the amorphous silicon by performing a thermal treatment on the amorphous silicon.

When the insulation layer 131' and the conductive layer 132' are formed on substantially the entire surface of the substrate 110 with uniform thickness, portions of the insulation layer 131' and the conductive layer 132' overlapping with the device isolation layer 120 may have elevated top surfaces from the top surface of the substrate 110. For example, the insulation layer 131' and the conductive layer 132' may form a stepped surface on the substrate 110 that corresponds to the position of the device isolation layer 120 on the substrate 110. i.e., the stepped surface may overlap the underlying device isolation layer 120. A thickness of the stepped surface of the insulation layer 131' and the conductive layer 132' may be substantially the same as a thickness of the insulation layer 131' and the conductive layer 132' adjacent to the stepped surface. A height of the stepped surface of the insulation layer 131' and the conductive layer 132' may correspond to a height difference between a top surface of the device isolation layer 120 and a top surface of the substrate 110.

When the insulation layer 131' is formed by oxidizing, the insulation layer 131' may be substantially excluded on the device isolation layer 120 and may be formed in the active region. Accordingly, the insulation layer 131' may be discontinuous and the conductive layer 132' may be a continuous layer formed on the discontinuous insulation layer 131' and the device isolation layer 120. A portion of the conductive layer 132' that overlaps the device isolation layer 120 may have an elevated top surface from the top surface of the substrate 110.

Figure 2C:
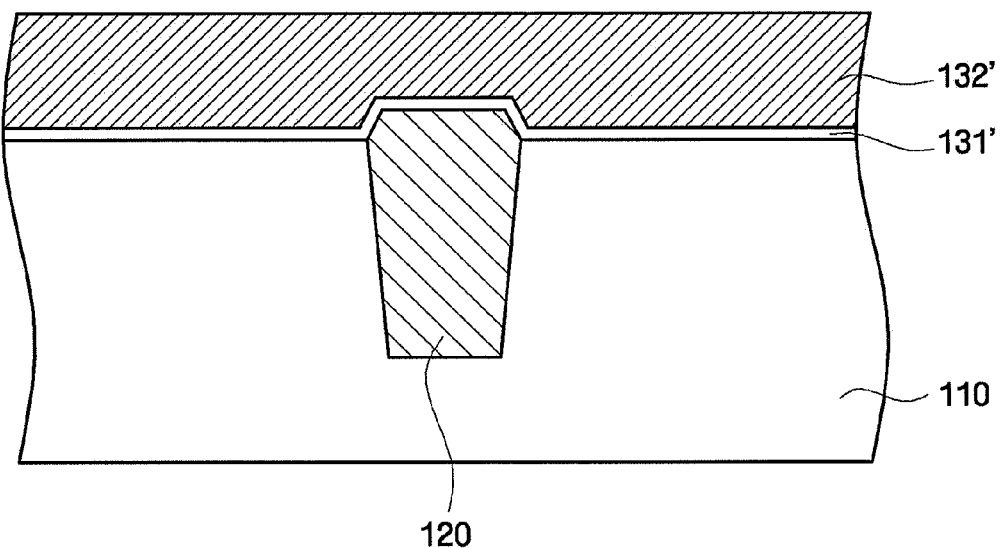

Referring to FIG. 2C, in stage S13, a step difference, i.e., the stepped surface of and the conductive layer 132', may be removed so that the top surface of the conductive layer 132' may be positioned at a same height from the top surface of the substrate 110, e.g., substantially the entire top surface of the conductive layer 132' may be positioned at a same distance from the substrate 110. For example, a top surface of the conductive layer 132' may be planarized to substantially remove the stepped surface and to form a substantially coplanar top surface of the conductive layer 132'. According to an exemplary embodiment, the stepped surface of the insulation layer 131' may remain on the substrate 110, e.g., may remain substantially unetched during the process stage of planarizing the top surface of the conductive layer 132'.

As the device isolation layer 120 may be elevated to a predetermined height from the top surface of the substrate 110, the conductive layer 132' positioned at the portion overlapping with the device isolation layer 120 may be elevated, so that the conductive layer 132' may have the step difference created by not having an even, planarized top surface. If the step difference were to remain, e.g., misalignment may occur in subsequent processes. For example, a misalignment may occur in the process of forming a contact hole, which may result in processing hardships.

Further, in order to reduce the step difference, an interlayer dielectric layer could be thickly formed in a subsequent process on the conductive layer 132'. However, if the interlayer dielectric layer is thickly formed, it may be quite difficult to deposit a thin film to a uniform thickness due to, e.g., an increased aspect ratio in forming a contact hole. As a semiconductor device is micro-patterned and a processing margin is decreased, the depositing difficulty may be gradually increasing due to the increased aspect ratio. In contrast, according to an exemplary embodiment, a planarizing process for substantially removing the step difference may be performed before forming a gate electrode, e.g., so that substantially the entire top surface of the conductive layer 132' may be positioned at the same height from the top surface of the substrate 110. The planarizing process to remove the step difference may facilitate subsequent processes and/or ultimately securing processing uniformity.

The planarizing may be performed by, e.g., a chemical mechanical polishing (CMP) process. In the CMP process, a polishing target material may be allowed to be pressed and closely contacted with a polishing pad. For example, during the CMP process the target material may be pressed with a polishing pad through a slurry therebeween. The slurry and/or the polishing pad may contain polishing particles. The CMP process may include movement of the polishing pad and/or the polishing target, e.g., a rotating movement after contacting the target material with the polishing pad through the slurry. The slurry may chemically react with the polishing target material and may physically rub the polishing target material to perform the CMP process.

Figure 2D:
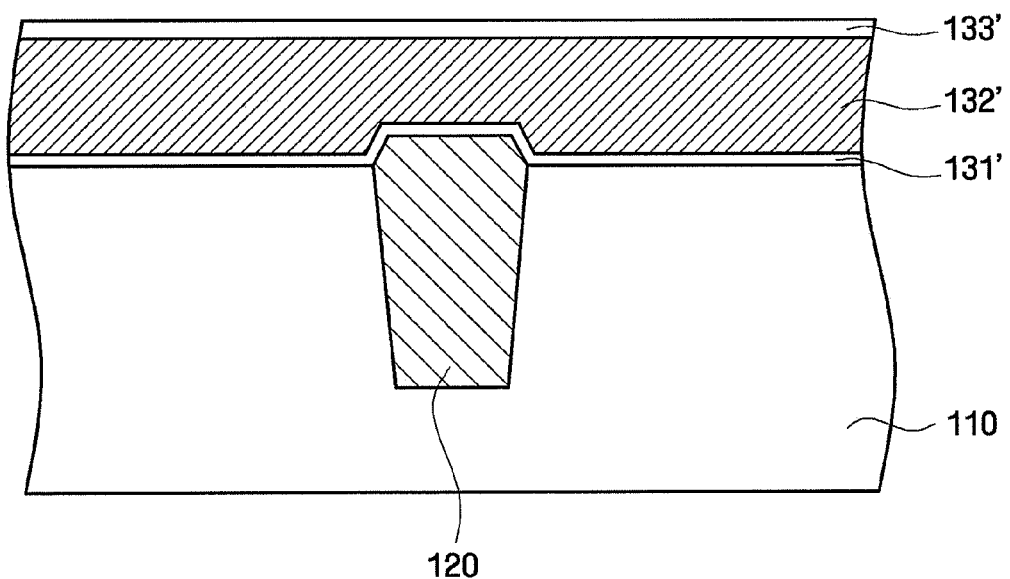

Referring to FIG. 2D, in stage S14, a nitride layer 133' may be formed on, e.g., directly on, the conductive layer 132' having the planarized surface.

The nitride layer 133' may be formed on the conductive layer 132' to have, e.g., a uniform thickness. The nitride layer 133' may be substantially free of a stepped surface since the nitride layer 133' is formed on the conductive layer 132' having the planarized surface. The nitride layer 133' may be formed by, e.g., a CVD process. The nitride layer 133' may be made of, e.g., SiN or SiON.

The nitride layer 133' may be used as, e.g., a hard mask layer for forming a gate electrode in a subsequent process. The nitride layer 133' may protect the gate electrode and/or serve as an etch stopping layer in a subsequent manufacture process of a semiconductor device including a gate. According to an exemplary embodiment, the forming of the nitride layer in stage S14 may be skipped according to the necessity of one skilled in the art.

Figure 2E:
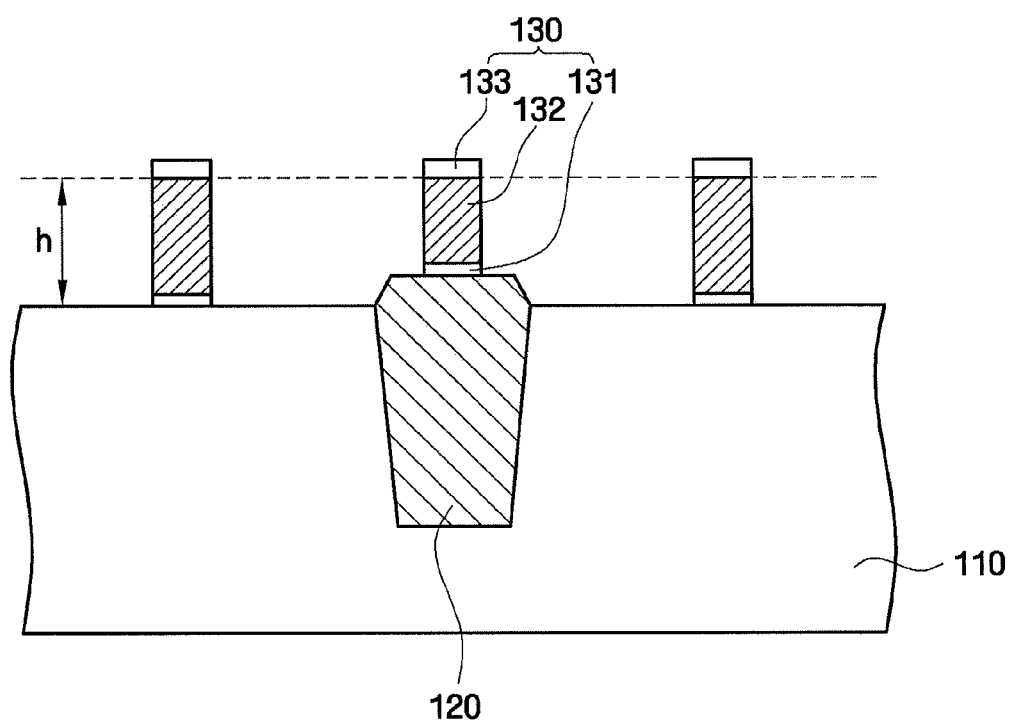

Referring to FIG. 2E, in stage S15, the stack having the insulation layer 131', the conductive layer 132' and the nitride layer 133' sequentially stacked on the substrate 110 may be patterned to form a gate electrode 132.

The stack may include the insulation layer 131' for a gate insulation layer, the conductive layer 132' for a gate electrode, and the nitride layer 133' for a hard mask layer. The stack may be patterned by, e.g., a photolithography process. The patterning of the stack may form a gate pattern 130. The gate pattern 130 may include the gate insulation layer 131, the gate electrode 132, and the hard mask layer 133, e.g., sequentially stacked therein. According to an exemplary embodiment, the gate pattern 130 has a stack of the gate insulation layer 131, the gate electrode 132 and the hard mask layer 133. However, embodiments are not limited thereto, e.g., the hard mask layer 133 formed of a nitride layer on the gate electrode 132 may be not be formed, i.e., may be excluded in the process of forming the stack.

In the illustrated embodiment, the conductive layer 132' is planarized before the forming of the gate electrode 132. In a case where a plurality of gate patterns 130 are formed, as shown in FIG. 2E, top surfaces of gate electrodes 132 may all positioned at substantially the same height h, e.g., a same distance, from the top surface of the substrate 110 and/or at substantially the same height, e.g., same distance, from the bottom surface of the substrate 110. If the nitride layer 133 is included in the gate pattern 130, the top surfaces of the nitride layer 133 may be positioned at substantially a same height from the top and/or bottom surfaces of the substrate 110. Therefore, since there is no step difference with respect to the top surfaces of the gate electrodes 132, e.g., between layers in a subsequent process, it may not be necessary to form the interlayer dielectric layer thickly, thereby securing processing uniformity.

As illustrated in FIG. 2E, the gate pattern 130 may include at least one gate electrode 132 arranged on the top surface of the substrate 110, e.g., an uppermost surface of the substrate 110, and at least one gate electrode 132 arranged on the top surface of the device isolation layer 120. A lowermost layer, e.g., a lowermost surface of the gate insulation layer 131, of at least one gate electrode 132 arranged on the top surface of the device isolation layer 120 may be further away from the substrate 110 than a lowermost layer, e.g., a lowermost surface of the gate insulation layer 131, of at least one gate 132 arranged on the top surface of the substrate 110. For example, a height of the gate electrode 132 in the at least one gate electrode 132 arranged on the top surface of the device isolation layer 120 may be less than a height of the gate electrode 132 in the at least one gate electrode 132 arranged on the top surface of the substrate 110.

Figure 2F:
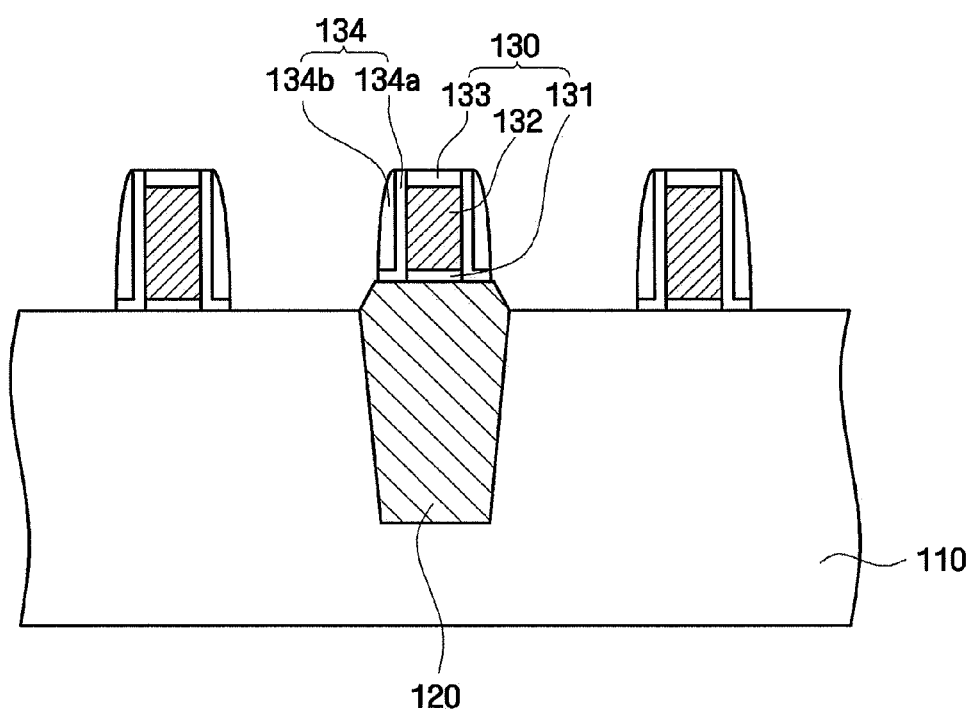

Referring to FIG. 2F, in stage S16, a gate spacer 134 may be formed on sidewalls of the gate patterns 130.

The gate spacer 134 may be formed of an oxide layer or a nitride layer. Alternatively, the gate spacer 134 may have a dual layered structure having an oxide layer and a nitride layer. FIG. 2F illustrates an exemplary gate spacer having a first spacer 134a and a second spacer 134b.

The first spacer 134a may be formed on sidewalls of the gate pattern 130 by, e.g., an oxidation process. When the oxidation process is performed, an oxide layer may be formed to extend from the sidewalls of the gate patterns 130 to the active region of the substrate 110. The oxide layer formed on the sidewalls of the gate pattern 130, e.g., the first spacer 134a, may protect side surfaces of the gate electrode 132. While the oxidation process for forming the first spacer 134a is performed, defects of the substrate 110 may be cured. As such, the oxidation process may improve the reliability of the semiconductor device.

After forming the first spacer 134a, e.g., after the oxidation process, an insulation layer may be conformally formed on substantially the entire surface of the resultant structure having the gate pattern 130 and the first spacer 134a. The insulation layer may be etched, e.g., anisotropically etched, to form the second spacer 134b on the sidewalls of the first spacer 134a. The second spacer 134b may be formed directly on outer lateral sides of the first spacer 134a, and the outer laterals sides may be opposite sides of the first spacer 134a adjacent to the gate pattern 130. The insulation layer may be, e.g., a nitride layer. The insulation layer may be formed by a CVD process.

As described above, in an exemplary method of fabricating a gate, a plurality of gate patterns 130 having a stacked structure, e.g., including the gate insulation layer 131 and the gate electrode 132 may be formed on the substrate 110. The gate electrodes 132 of the plurality of gate patterns 130 may have top surfaces positioned at the same height from the top surface of the substrate 110, thereby enhancing the possibility of securing processing uniformity in subsequent processes and achieving uniformity in device characteristics. Further, it may not be necessary to thickly form the interlayer dielectric layer to reduce a step difference in the resultant semiconductor device.

Figure 3:
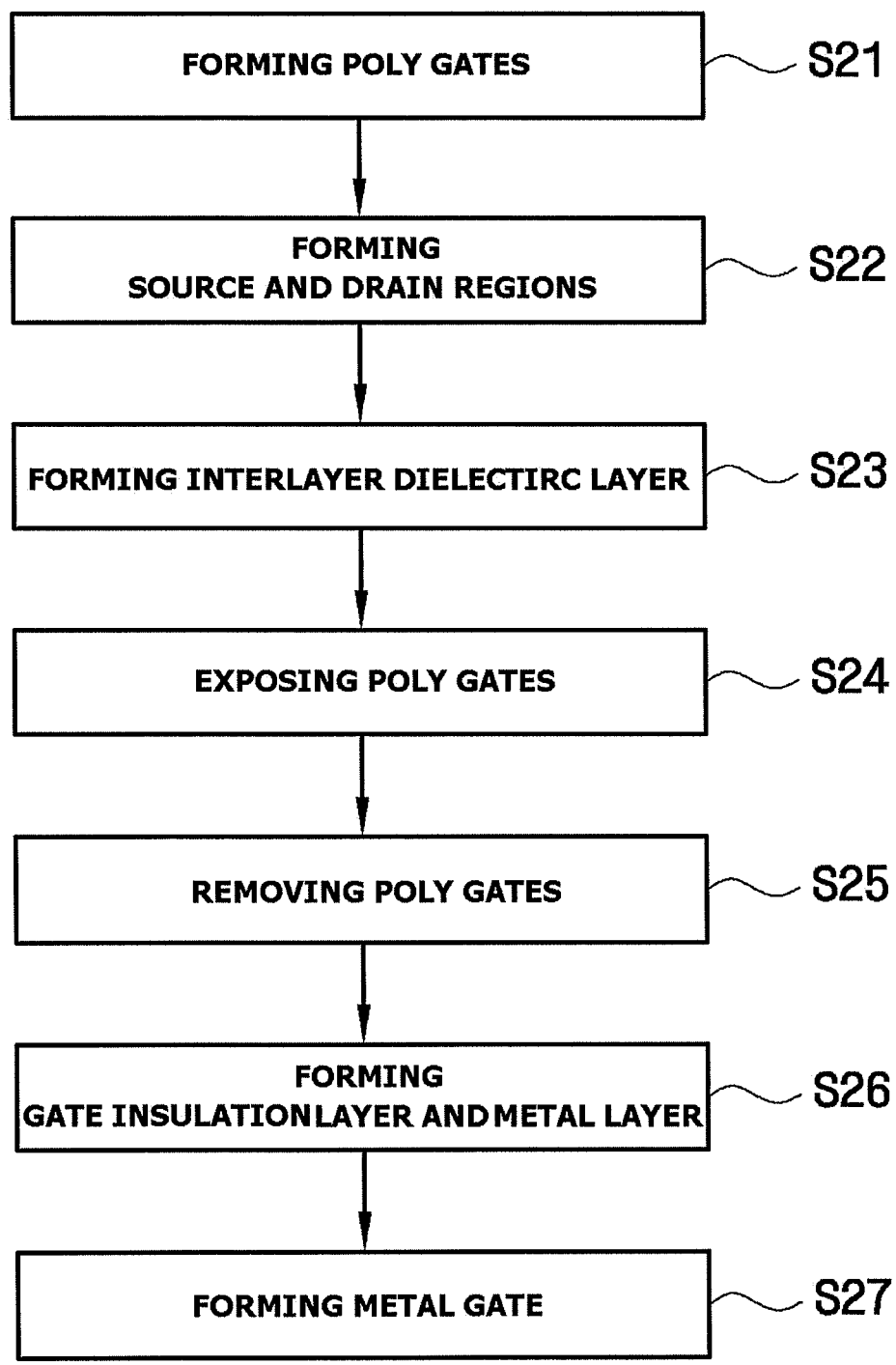
FIG. 3 illustrates a flowchart of a method of manufacturing a semiconductor device, according to an exemplary embodiment.

A method of manufacturing a semiconductor device according to another exemplary embodiment will be described with reference to FIGS. 3 and 4A to 4G. FIG. 3 illustrates a flowchart of a method of manufacturing a semiconductor device according to the other exemplary embodiment, and FIGS. 4A to 4H illustrates cross-sectional of sequential exemplary stages in an exemplary method of manufacturing the semiconductor device shown in FIG. 3.

Referring to FIG. 3, the method of manufacturing a semiconductor device according to the exemplary embodiment may include the stages of, e.g., forming poly gates (S21), forming source and drain regions (S22), forming an interlayer dielectric layer (S23), exposing the poly gates (S24), removing the poly gates (S25), forming a gate insulation layer and a metal layer (S26), and forming a metal gate (S27).

Figure 4A:
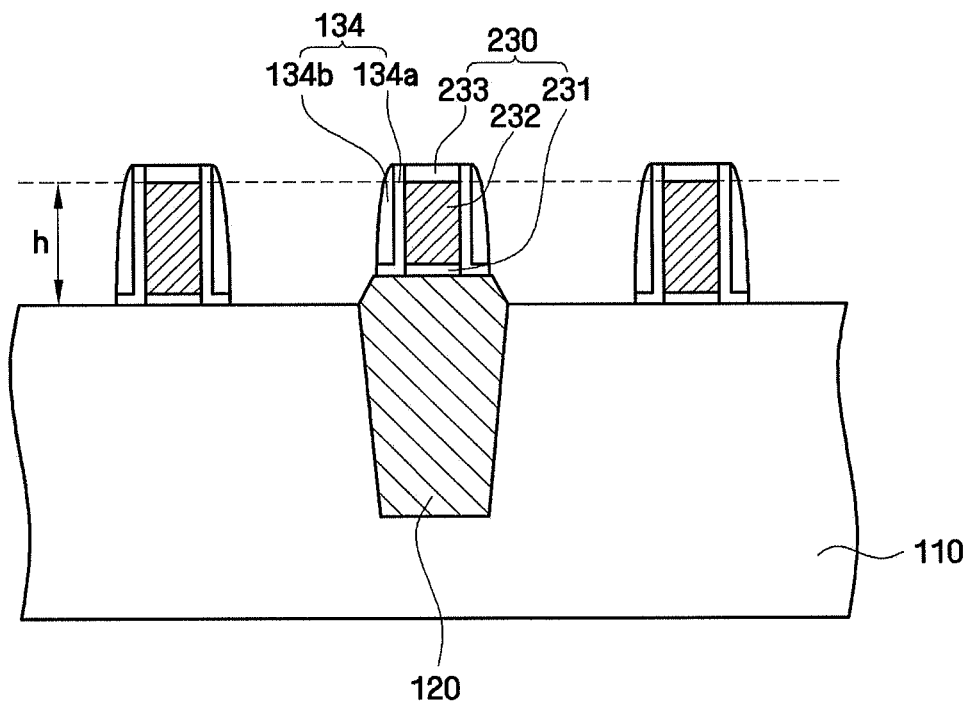
FIGS. 4A to 4H illustrate cross-sectional views of stages in an exemplary process of manufacturing the semiconductor device shown in FIG. 3.

Referring to FIG. 4A, in stage S21, a plurality of gate patterns, which are referred to as poly gates 230 hereinafter, may each include a dummy gate electrode 232 formed on a substrate 110. The dummy gate electrode 232 may be made of polysilicon.

The poly gates 230 are formed on the substrate 110 in substantially the same and/or the same manner as shown in FIGS. 2A to 2F, which illustrate an exemplary method of fabricating a gate. For example, after the forming of the poly gates 230, gate spacers 134 may be formed in the same manner as described above in the method of fabricating a gate according to the exemplary embodiment. Thus, detailed descriptions of methods of forming the poly gates 230 and the gate spacers 134 will not be given.

FIG. 4A illustrates the poly gates 230, and the poly gates 230 may each include a dummy gate insulation layer 231, a dummy gate electrode 232, and a hard mask layer 233. The dummy gate electrode 232 may be made of polysilicon. A conductive layer for the dummy gate electrode 232 may be formed in substantially the same and/or the same manner as described above in the method of fabricating a gate according to an exemplary embodiment. Thereafter, the conductive layer may be planarized so that substantially entire top surfaces of the dummy gate electrode 232 in each of the poly gates 230 may be positioned at a same height h from the top surface of the substrate 110. For example, substantially an entire top surface of a dummy gate electrode 232 of a poly gate 230 on the device isolation layer 120 may be at a same height h from the top surface of the substrate 110 as a dummy gate electrode 232 of a poly gate 230 spaced apart from the device isolation layer 120. Accordingly the top surfaces of all the dummy gate electrodes 232 of the poly gates 230 may be disposed along a same plane to form coplanar surfaces.

Figure 4B:
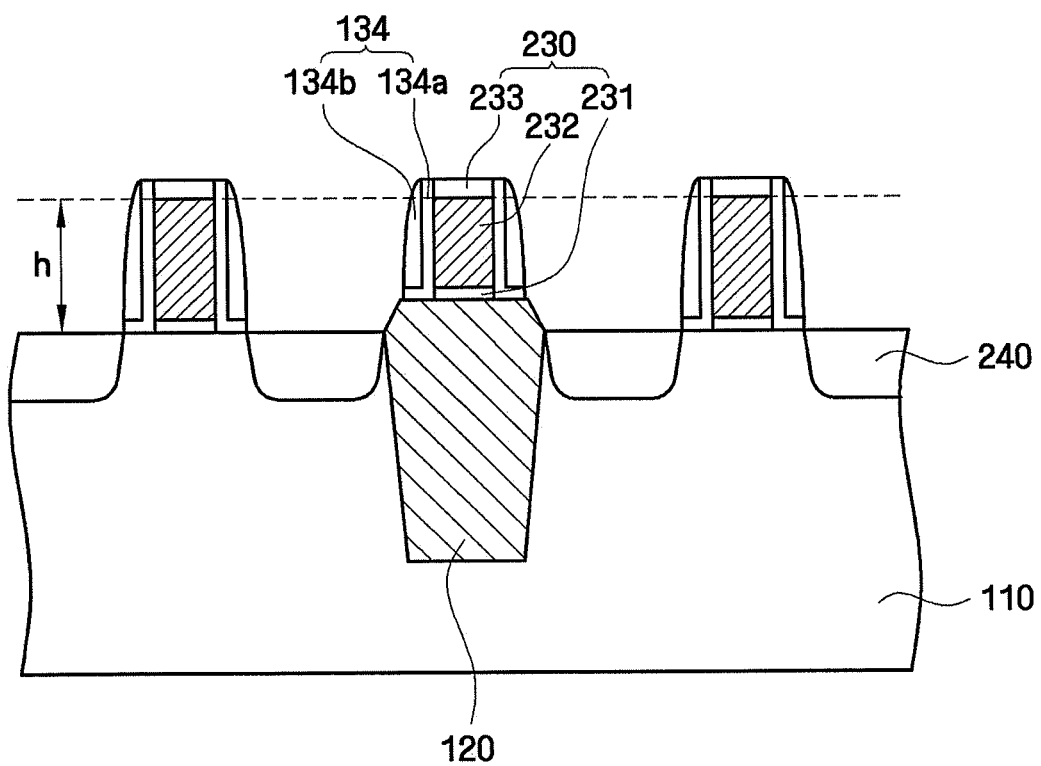

Referring to FIG. 4B, in stage S22, source and drain regions 240 may be formed by implanting impurity into the substrate 110. The source and drain regions 240 may be formed at both sides of the poly gates 230, e.g., at both sides of each of the poly gates 230.

According to an exemplary embodiment, the source and drain regions 240 may be formed by injecting, e.g., a high concentration impurity, into the substrate 110 at both sides of the poly gates 230 by an ion implantation process. The ion implantations process may include using the poly gates 230 and the gate spacers 134 as ion implantation masks. For example, in a case of an NMOS region, n-type impurity, e.g., phosphorus (P) or arsenic (As), may be injected into the substrate 110, and in a case of a PMOS region, p-type impurity, e.g., boron (B) or gallium (Ga), may be injected into the substrate 110.

Figure 4C:
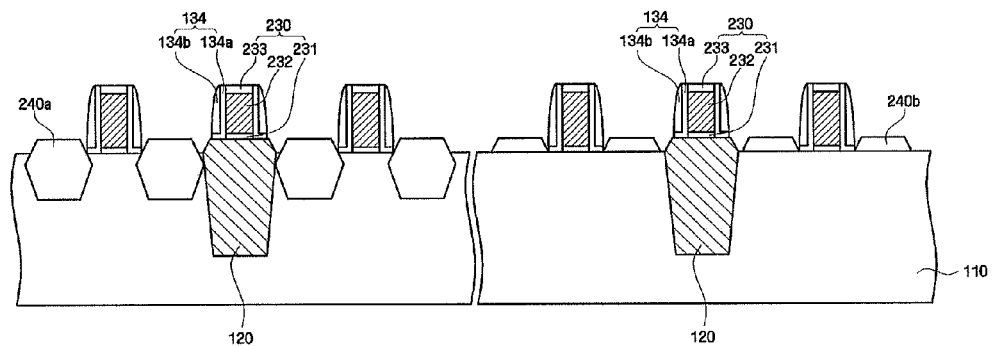

According to another exemplary embodiment, the source and drain regions 240 may be formed by epitaxial growth and may have an elevated source/drain structure. The elevated source/drain structure may extend from the top surface of the substrate 110, e.g., as illustrated in FIG. 4C. For example, in the case of NMOS, the source and drain regions 240 may be formed of an epitaxial silicon layer or an epitaxial silicon carbide (SiC) layer epitaxially grown on the substrate 110. In the case of PMOS, the source and drain regions 240 may be formed of a silicon germanium (SiGe) layer epitaxially grown on the substrate 110. More specifically, in the case of NMOS, at least one of $Si_2H_6$, $SiH_4$, $SiH_2Cl_2$, and $Si_3H_8$ gases may be used as a Si source and $PH_3$ may be used as an n-type dopant source, and these may be supplied onto the substrate 110 at both sides of the poly gates 230 and the gate spacers 134 to foam a silicon layer doped with n-type dopant by selective epitaxial growth using, e.g., low pressure chemical vapor deposition (LPCVD) or ultrahigh vacuum chemical vapor deposition (UHVCVD), to form the source and drain regions 240. In the case of PMOS, at least one of $Si_2H_6$, $SiH_4$, $SiH_2Cl_2$, and $Si_3H_8$ gases may be used as an Si source, $GeH_4$ gas may be used as a Ge source, and $B_2H_6$ gas may be used a p-type dopant source, and these gases may be supplied onto the substrate 110 at both sides of the poly gates 230 and the gate spacers 134, e.g., to form a silicon germanium layer doped with p-type dopant by selective epitaxial growth; thereby, forming source and drain regions 240. The selective epitaxial growth may be carried out at a temperature in a range of about 400° C. to about 650° C. using, e.g., HCl gas as an etching gas.

FIG. 4C illustrates an exemplary CMOS including an NMOS having source and drain regions formed of the epitaxial silicon layer 240b and a PMOS having source and drain regions formed of the epitaxial silicon germanium layer 240a. The source and drain regions 240a in the PMOS region may be elevated from the surface of the substrate 110 at both sides of poly gates 230, e.g., like in NMOS. Alternatively, as shown in FIG. 4C, the source and drain regions 240a may be formed by epitaxial growth in an epitaxial layer forming a trench. For example, an epitaxial layer forming trench may be formed by etching a predetermined portion of the substrate 110 at both sides of the poly gates 230. An epitaxial silicon germanium layer may be formed in the epitaxial layer forming trench by epitaxial growth. For example, the epitaxial layer forming trench may be formed by forming a preliminary trench in the substrate 110 and further laterally etching sidewalls of the preliminary trench. The epitaxial layer forming trench may have a hexagonal profile.

A tip corresponding to a location where the hexagonal profile of the epitaxial layer forming trench has the maximum width may be positioned on the same line with sidewalls of the poly gates 230 and may be close to a channel region. The silicon germanium layer may apply a compressive stress to the channel region, e.g., to improve carrier mobility in the channel region, thereby improving device characteristics. In a case where the epitaxial layer forming trench has a hexagonal profile, it may become closer to the channel region, which may further increase the compressive stress applied to the channel region. For example, at least one tip of the hexagonal profile of the epitaxial layer may be adjacent to a channel region of the adjacent poly gate 230. In this regard, the at least one tip of the hexagonal profile may extend in the substrate to a region under the gate spacer 134 of the adjacent poly gate 230.

Although not shown, after forming the poly gates 230 and before forming the gate spacers 134, a lightly doped impurity region may be formed by implanting low concentration impurity ion into the substrate at both sides of the poly gates 230 using only the poly gates 230 as ion implantation masks. The lightly doped impurity region may mitigate electric fields of source and drain regions and/or reduce leakage current.

Figure 4D:
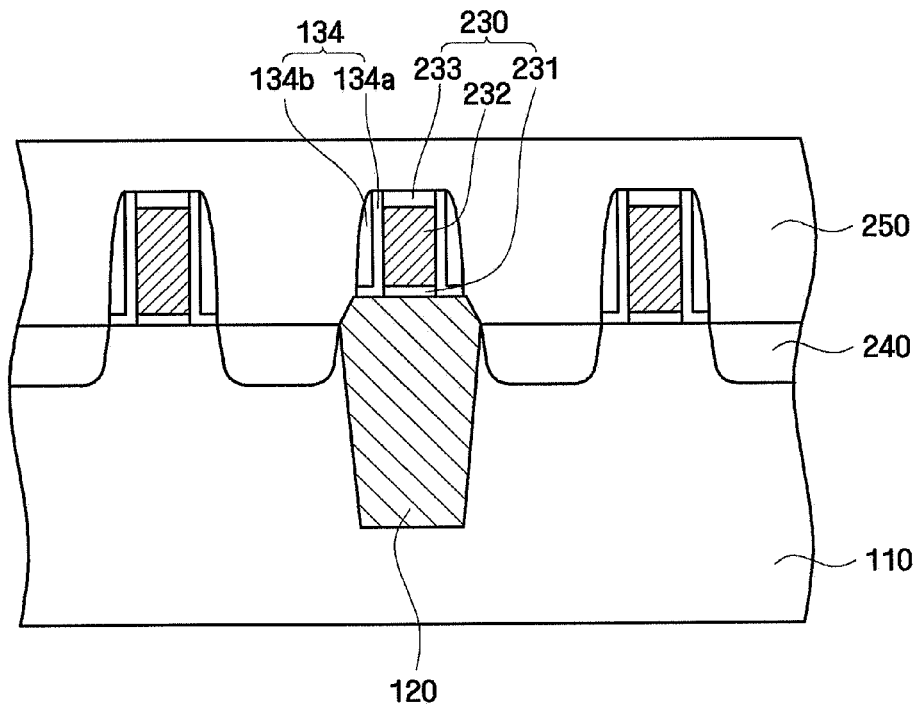

Referring to FIG. 4D, in stage S23, an interlayer dielectric layer 250 may be formed on substantially the entire surface of the substrate 110. For example, the interlayer dielectric layer 250 may be deposited on the poly gates 230, the gate spacers 134, and the source and drain regions 240 using, e.g., a CVD process.

The interlayer dielectric layer 250 may reduce a step difference on the surface of the substrate 110. In an exemplary embodiment, before forming the poly gates 230 on the substrate 110, a planarizing process may be performed. The planarizing process may be performed so that the top surfaces of all the dummy gate electrodes 232 may be positioned at a same height from the top surface of the substrate 110 and/or at a same height from the bottom surface of the substrate 110. Further, top surfaces of all the hard mask layers 233 may be positioned at a same height from the top surface of the substrate 110. Therefore, accordingly to an exemplary embodiment, the interlayer dielectric layer 250 may not be thickly formed, e.g., an amount of interlayer dielectric may be reduced, based on the planarization process.

The interlayer dielectric layer 250 may include, e.g., silicon oxide, SiON, $Ge_xO_yN_z$, $Ge_xSi_yO_z$, a high-k dielectric material or a combination thereof, or a stacked structure of these materials sequentially stacked therein.

Figure 4E:
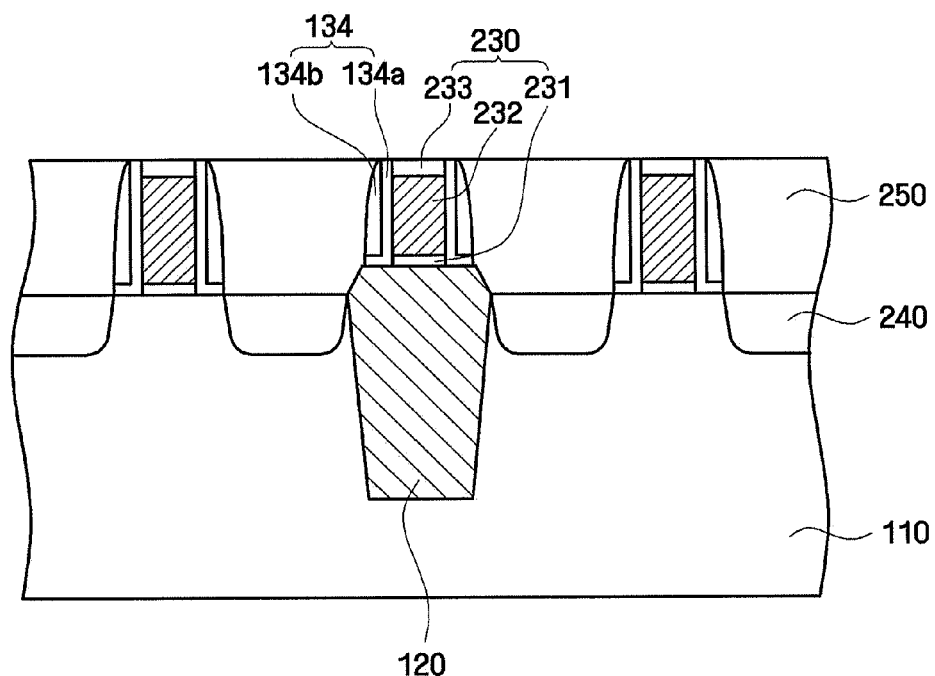

Referring to FIG. 4E, in stage S24, the interlayer dielectric layer 250 may be removed until the hard mask layers 233 of the poly gates 230 are exposed. For example, the hard mask layer 233 of the poly gates 230 may be exposed by etching the interlayer dielectric layer 250. The hard mask layer 233 may serve as an etch stopper layer. The etching of the interlayer dielectric layer 250 may be carried out by, e.g., a CMP process.

The planarizing process may be performed after depositing a conductive layer for a gate electrode in the forming of the poly gates 230. Thus, in all the poly gates 230 formed on the substrate 110, the top surfaces of the dummy gate electrodes 232 and the hard mask layers 233 may be positioned at the same heights from the top surface of the substrate 110. This arrangement of the top surfaces of the dummy gate electrodes 232 and the hard mask layers 233 may allow all the poly gates 230 formed on the substrate 110 to be exposed, e.g., simultaneously, when the interlayer dielectric layer 250 is etched. If the planarizing process of the conductive layer were not performed during the forming of the poly gates 230, the top surface of the dummy gate electrode formed on the device isolation layer 120 may be positioned higher than the top surface of the dummy gate electrode formed on the active region of the substrate 110. Thus, the hard mask layer 233 formed on the active region may not be exposed while the hard mask layer 233 on the device isolation layer 120 is exposed during the process of etching the interlayer dielectric layer 250. Thus, there may be processing hardships and processing uniformity may not be secured.

Figure 4F:
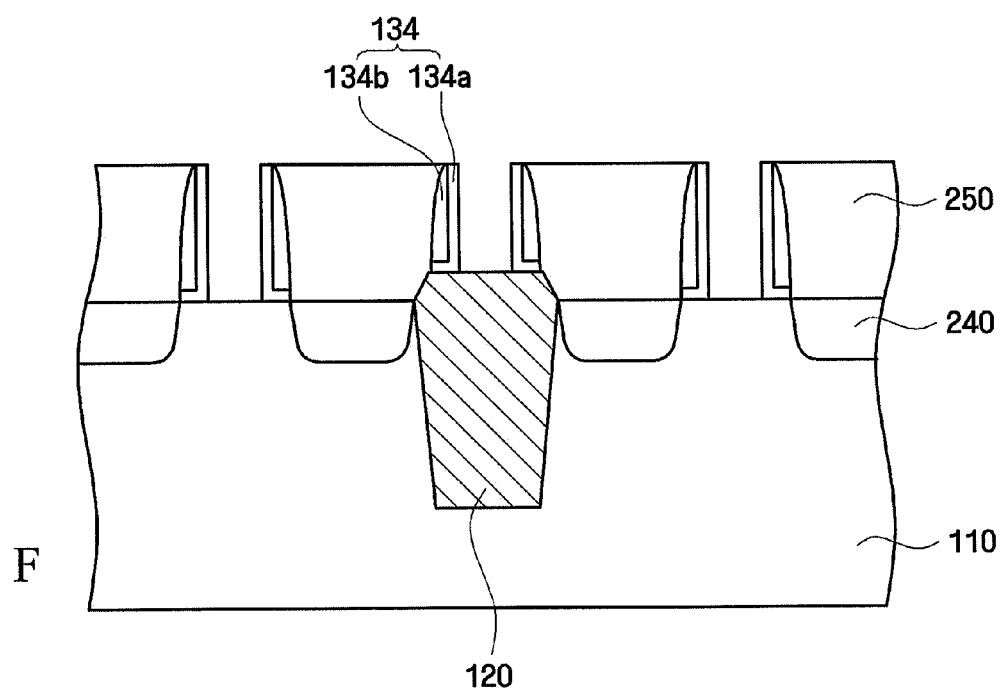

Referring to FIG. 4F, in stage S25, the hard mask layer 233 that were exposed in the previous process stage, the dummy gate electrode 232, and the dummy gate insulation layer 231 are removed. The hard mask layer 233, the dummy gate electrode 232, and the dummy gate insulation layer 231 may be sequentially etched for removal. Thereafter, a groove may be formed at a region produced after removing the hard mask layer 233, the dummy gate electrode 232, and the dummy gate insulation layer 231.

If the top surfaces of the dummy gate electrodes 232 were not all positioned at substantially the same height from the substrate 110, the poly gates formed on the active region may not be exposed because the interlayer dielectric layer 250 may still remain on the poly gates, i.e., may not be removed from the top surfaces of the hard mask layer 233 of each of the poly gates 230. However, according to an exemplary embodiment, the planarizing process is carried out after depositing the conductive layer for a gate electrode. Thus, the poly gates 230 on the substrate 110 may be exposed, e.g., simultaneously exposed, by the etching of the interlayer dielectric layer 250 and may be removed in stages S24 and S25. Therefore, processing uniformity may be secured. The removal of the poly gates 230 may form voids on the substrate 110.

Figure 4G:
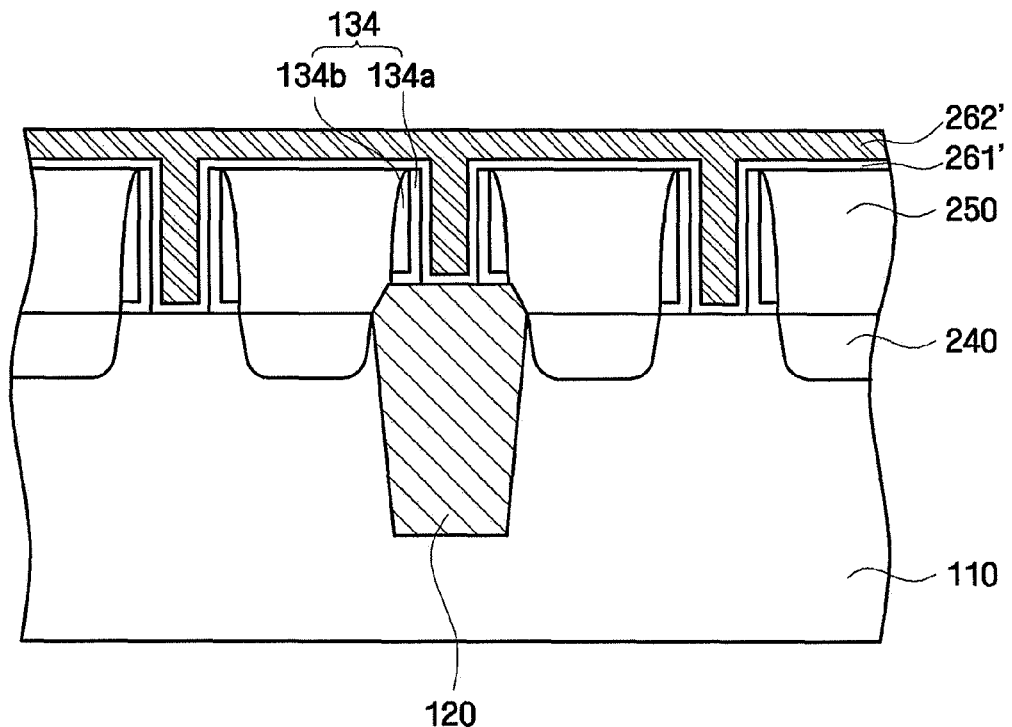

Referring to FIG. 4G, in stage S26, an insulation layer for a gate insulation layer 261' and a metal layer 262' may be deposited on substantially the entire surface of the substrate 110. The gate insulation layer 261' and the metal layer 262' may be deposited on the interlayer dielectric layer 250 and in the voids on the substrate 110. The insulation layer for a gate insulation layer 261' may be deposited on substantially the entire surface of the substrate 110 to form a layer having a substantially uniform thickness by, e.g., a CVD process. The metal layer 262' may be deposited on the insulation layer 261' by, e.g., a CVD process or a sputtering process. The depositing of the metal layer 262' may be performed while filling the voids formed after removing the hard mask layer 233, the dummy gate electrode 232, and the dummy gate insulation layer 231.

The metal layer 262' may include, but is not limited to, a single layer made of and/or including a metal such as Tantalum (Ta), Tantalum nitride (TaN), Tantalum silicon nitride (TaSiN), Titanium nitride (TiN), Molybdenum (Mo), Ruthenium (Ru), or Nickel (Ni), a metal silicide such as NiSi, and combinations thereof or a stacked structure including combinations of these metal layers.

Figure 4H:
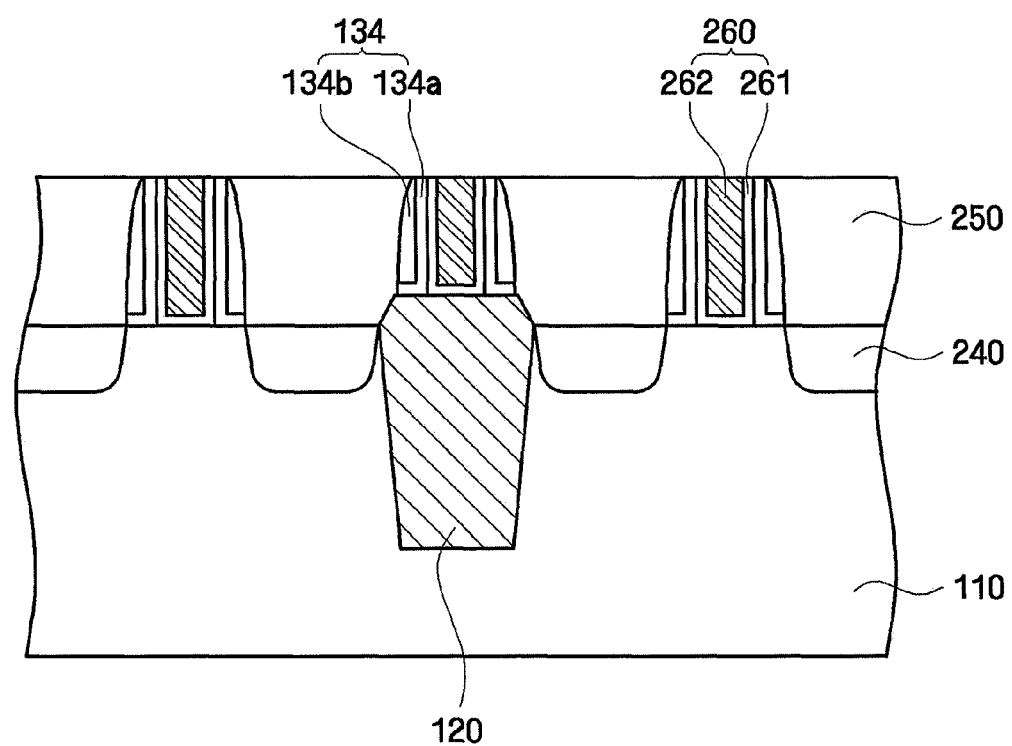

Referring to FIG. 4H, in stage S27, the insulation layer for a gate insulation layer 261' and the metal layer 262' may be etched to form the gate insulation layer 261 and the metal gate 260, respectively. Specifically, the insulation layer for a gate insulation layer 261' and the metal layer 262' may be removed until the remaining interlayer dielectric layer 250 is exposed; thereby, forming a metal gate 260 including a gate insulation layer 261 and a metal gate electrode 262. The insulation layer for the gate insulation layer 261' and the metal layer 262' may be removed by a CMP process.

In such a manner, a metal gate having a gate electrode made of, e.g., a metal or metal silicide, may be formed. In a case where the gate electrode is made of a metal or metal silicide, low resistance may be implemented with a finer linewidth and the doping of an impurity may be avoided.

As described above, in the method of manufacturing a semiconductor device according to an exemplary embodiment, the conductive layer for the dummy gate electrodes 232 may be planarized prior to forming the poly gates 230, e.g., to allow the poly gates 230 to be simultaneously exposed and simultaneously removed when the interlayer dielectric layer 250 is etched. This process may secure processing uniformity. Accordingly, processing hardships rendered, e.g., when it is necessary to perform the removal process of the interlayer dielectric layer 250 several times because some of poly gates 230 are not exposed due to a step difference created between the poly gates 230, and/or an occurrence of misalignment may be avoided.

In addition, since the step difference between layers is reduced by performing the planarizing process of the conductive layer prior to forming of the poly gates 230, a thickness of the dielectric layer 250 may be reduced, e.g., it may not be necessary to form the interlayer dielectric layer 250 thickly. Accordingly, subsequent processes may be performed uniformly, which may facilitate formation of a metal gate electrode from a polysilicon gate electrode.

Hereinafter, merits and effects of embodiments will be described in detail through experimental examples, which are, provided only for illustration but are not intended to limit the scope of the present invention.

In the method of manufacturing a semiconductor device according to an exemplary embodiment, a silicon oxide ($SiO_x$) layer and a polysilicon layer are sequentially deposited on a substrate having a device isolation layer formed by a STI technique in the same manner as shown in FIGS. 4A to 4E. Then, the polysilicon layer is planarized by a CMP process. Next, a nitride (SiN) layer is stacked on the planarized polysilicon layer and patterned to form a gate. Thereafter, a silicon oxide ($SiO_x$) layer as an interlayer dielectric layer is stacked to a thickness of approximately 230 nm and then removed by another CMP process, followed by dry etching the stacked nitride layer to expose a polysilicon gate. In the comparative example, a semiconductor device is manufactured in substantially the same manner as in the exemplary embodiment, except that a planarizing process is performed by a CMP process after stacking of a polysilicon layer.

Figure 5A:
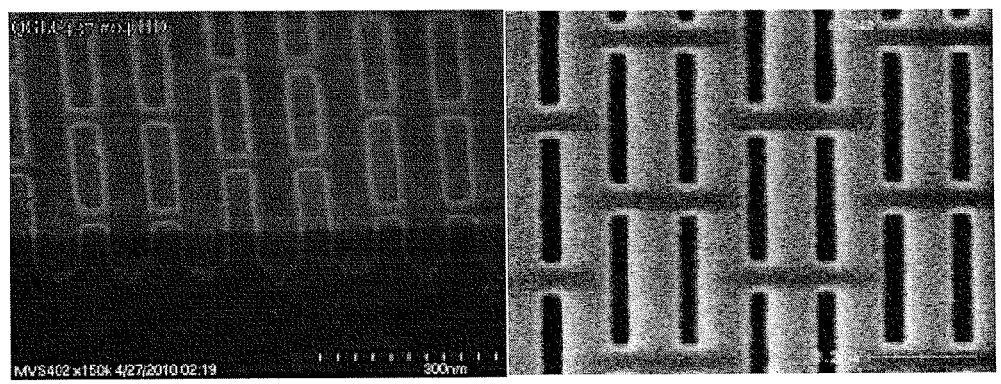
FIG. 5A illustrates scanning electron microscope (SEM) images of observation results of a gate, according to an exemplary embodiment.
Figure 5B:
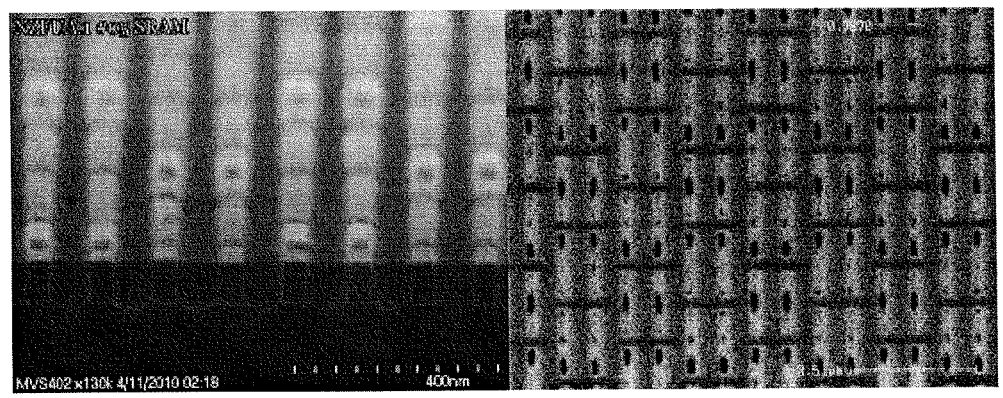
FIG. 5B illustrates scanning electron microscope (SEM) images of observation results of a gate, according to a comparative example.

Observation results of a gate according to an exemplary embodiment and a gate according to comparative example are illustrated in FIGS. 5A and 5B. FIGS. 5A and 5B are images taken from a scanning electron microscope (SEM) that illustrate observation results of a gate according to an exemplary embodiment and a gate according to a comparative example.

As shown in FIG. 5, in the method of manufacturing a semiconductor device according to an exemplary embodiment, since top surfaces of gates are positioned at the same height from the substrate, an oxide layer as an interlayer dielectric layer is substantially completely removed while not remaining on the top surfaces of the poly gates. In the comparative example, however, an oxide layer as an interlayer dielectric layer is not removed from some of poly gates due to a step difference and white portions are still observed from on the top surfaces of the gates.

By way of summation and review, in the manufacture of a semiconductor device, in order to form transistors and capacitors, the semiconductor device may include an active region and an isolation region. The active region may be capable of electrically conducting and the isolation region may isolate devices by, e.g., minimizing and/or preventing electrical conduction between adjacent active regions. When a top surface of the isolation region is higher than a top surface of a substrate, heights of adjacent gate electrodes formed on the substrate may not be uniform, which may result in processing hardships in subsequent processes. In particular, unwanted irregularities may be generated in the manufacture of the semiconductor device. The irregularities may make it more difficult to form a desired pattern, e.g., by a one-time process. The uniformity of a semiconductor device may also be damaged.

In contrast, embodiments, e.g., the exemplary embodiments discussed above, relates to a method that may include performing a planarizing process after depositing a layer, e.g., a conductive layer, for a gate electrode or a dummy gate electrode. This method of fabricating a gate may facilitate subsequent processes and/or ultimately secure processing uniformity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. It is therefore desired that the present embodiments be considered in all respects as illustrative and not restrictive, reference being made to the appended claims rather than the foregoing description to indicate the scope of the invention. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
sequentially forming a dummy gate insulation layer and a polysilicon layer on substantially an entire surface of a substrate, the substrate having a device isolation layer therein, and a top surface of the device isolation layer being higher than a top surface of the substrate;
planarizing a top surface of the polysilicon layer;
forming a nitride layer on the polysilicon layer after planarizing the top surface of the polysilicon layer;
forming poly gates by patterning the dummy gate insulation layer, the polysilicon layer, and the nitride layer;
forming source and drain regions on both sides of the poly gates;
forming an interlayer dielectric layer on substantially the entire surface of the substrate; and
removing portions of the interlayer dielectric layer until the poly gates are exposed.

2. The method as claimed in claim 1, wherein the removal of the interlayer dielectric layer is performed by a chemical mechanical polishing process.

3. The method as claimed in claim 1, wherein the planarizing of the top surface of the polysilicon layer is performed by a chemical mechanical polishing process.

4. The method as claimed in claim 1, further comprising:
forming the device isolation layer in the substrate by etching the substrate to a predetermined depth to form a trench in the substrate, depositing an oxide layer such that the oxide layer is on substantially an entirety of the top surface of the substrate and fills the trench, and
removing the oxide layer deposited on the top surface of the substrate such that the oxide layer on the trench is higher by a predetermined height than the top surface of the substrate.

5. The method as claimed in claim 1, further comprising, after the removal of the portions of the interlayer dielectric layer such that the poly gates are exposed,
removing the poly gates exposed by the removal of the interlayer dielectric layer, the removal of the poly gates forming a groove;
forming a gate insulation layer to a uniform thickness in the groove and on the interlayer dielectric layer;
forming a metal layer on the gate insulation layer, the metal layer completely filling the groove formed by the removal of the poly gates, and
forming a metal gate by removing portions of the gate insulation layer and portions of the metal layer on the interlayer dielectric layer until the interlayer dielectric layer is exposed.

6. The method as claimed in claim 5, wherein the removal of the gate insulation layer and the metal layer is performed by a chemical mechanical polishing process.

7. The method as claimed in claim 1, further comprising, after the forming of the poly gates, forming gate spacers by depositing at least one of an oxide layer and a nitride layer on the substrate and the poly gates, and etching the at least one of the oxide layer and the nitride layer on the substrate.

8. The method as claimed in claim 1, wherein the source and drain regions are made of doped silicon or doped silicon germanium.

9. The method as claimed in claim 8, wherein the source and drain regions are formed on the substrate at both sides of the poly gates by a selective epitaxial growth process.

10. The method as claimed in claim 1, wherein the source and drain regions are formed by forming an epitaxial layer forming trench by etching a predetermined portion of the substrate at both sides of the poly gates, and forming a silicon germanium epitaxial layer in the epitaxial layer forming trench.

11. The method as claimed in claim 10, wherein the epitaxial layer forming trench has a hexagonal profile.

* * * * *